US009991682B2

(12) United States Patent
Wickett et al.

(10) Patent No.: US 9,991,682 B2
(45) Date of Patent: Jun. 5, 2018

(54) HOT-SWAPPABLE SYSTEM FOR AND METHOD OF DISTRIBUTING ELECTRICAL POWER AND/OR DATA TO AT LEAST ONE ELECTRICAL DEVICE

(71) Applicant: Nextek Power Systems, Inc., Detroit, MI (US)

(72) Inventors: Paul Wickett, Northville, MI (US); Alex M. Adelson, Andes, NY (US); Paul Savage, Detroit, MI (US); Ben Hartman, New York, NY (US)

(73) Assignee: Nextek Power Systems, Inc., Detroit, MI (US)

( * ) Notice: Subject to any disclaimer, the term of this patent is extended or adjusted under 35 U.S.C. 154(b) by 0 days. days.

(21) Appl. No.: 15/402,347

(22) Filed: Jan. 10, 2017

(65) Prior Publication Data

US 2017/0214224 A1    Jul. 27, 2017

Related U.S. Application Data

(60) Provisional application No. 62/281,367, filed on Jan. 21, 2016.

(51) Int. Cl.
| | |
|---|---|
| *H02B 1/052* | (2006.01) |
| *H05K 7/14* | (2006.01) |
| *G06F 1/18* | (2006.01) |
| *H02G 3/10* | (2006.01) |

(52) U.S. Cl.
CPC .............. *H02B 1/052* (2013.01); *G06F 1/18* (2013.01); *H02G 3/105* (2013.01); *H05K 7/1492* (2013.01)

(58) Field of Classification Search
CPC .. H05K 7/1489; H05K 7/1425; H05K 7/1492; H05K 7/20736; H05K 7/1488; H05K 7/20745; H05K 7/1487; G06F 1/183; G06F 1/26; G06F 1/30; G06F 1/189; G06F 1/263; G06F 1/20; G06F 1/18; (Continued)

(56) References Cited

U.S. PATENT DOCUMENTS 5,761,045 A * 6/1998 Olson ................... G06F 1/189
                                                312/223.2
5,993,241 A * 11/1999 Olson ................... G06F 1/189
                                                439/160

(Continued)

OTHER PUBLICATIONS

International Search Report in corresponding international application No. PCT/US17/13087 dated Apr. 12, 2017.

*Primary Examiner* — Adam B Dravininkas
(74) *Attorney, Agent, or Firm* — Kirschstein, Israel, Schiffmiller & Pieroni, P.C.

(57) ABSTRACT

Electrical power and/or data are distributed to one or more electrical devices, preferably mounted on a structure. A first source module is electrically connected to an electrical power and/or data source. Additional source modules are connected in a daisy chain to the first source module. A plurality of system modules is mounted on the source modules. Each system module is electrically connectable to, and disconnectable from, a module connector of a respective source module. Each system module is removable from the respective source module for replacement without powering down the power and/or data source, and without affecting the data distribution.

19 Claims, 17 Drawing Sheets

(58) Field of Classification Search
CPC . G06F 1/181; G06F 1/184; G06F 1/28; G06F 1/188; G06F 1/1632; H02B 1/26; H02B 1/052
See application file for complete search history.

(56) References Cited

U.S. PATENT DOCUMENTS

| | | | |
|---|---|---|---|
| 6,198,642 B1* | 3/2001 | Kociecki | H02M 1/4225 307/150 |
| 6,331,933 B1* | 12/2001 | Rumney | G06F 1/184 174/541 |
| 6,418,015 B1* | 7/2002 | Kociecki | H02M 1/4225 307/150 |
| 2006/0041783 A1* | 2/2006 | Rabinovitz | G06F 1/187 714/6.12 |
| 2006/0090633 A1* | 5/2006 | Muramatsu | G10C 3/12 84/723 |
| 2010/0265645 A1* | 10/2010 | Wang | G06F 1/181 361/679.4 |
| 2010/0288526 A1 | 11/2010 | Meyer | |
| 2013/0012061 A1 | 1/2013 | Rotzoll | |
| 2013/0271926 A1 | 10/2013 | Marroquin | |
| 2014/0239718 A1* | 8/2014 | Giles | G06F 1/263 307/26 |

* cited by examiner

HOT-SWAPPABLE SYSTEM FOR AND METHOD OF DISTRIBUTING ELECTRICAL POWER AND/OR DATA TO AT LEAST ONE ELECTRICAL DEVICE

FIELD OF THE DISCLOSURE

The present disclosure relates generally to a hot-swappable system for, and a method of, distributing electrical power and/or data to one or more electrical devices.

BACKGROUND

Power and/or data supply systems are employed in numerous diverse fields to supply electrical power and/or data to a myriad of electrical devices. Such systems typically have power and/or data supply components electrically connected between power and/or data sources and the electrical devices. Over time, such supply components may need to be replaced or repaired upon component failure or during routine maintenance, or additional such supply components may need to be added when additional electrical devices are installed in such systems. Typically, all such procedures require the entire system, and especially the power and/or data sources, to be shut down and deenergized as a safety precaution. Yet, the shutting down and deenergization of the entire system, which may comprise many such supply components, when, for example, only one such supply component needs to be removed or added, is undesirable in many industries.

By way of but one example, in the building industry, a suspended or drop ceiling in a building includes an overhead structure, such as a grid framework of mutually orthogonal, elongated, frame elements that bound quadrilateral openings into selected ones of which ceiling tiles as well as various electrical devices are mounted and supported. Such electrical devices may, for example, include lighting fixtures, loudspeakers, electrical controls, air conditioning units, electric fans, electric signs, and the like. It is desirable to supply electrical power and/or data not only to such framework-mounted electrical devices, but also to other electrical equipment, such as computers, printers, copiers, and the like, located in an office or home environment in a room in which the framework is suspended overhead. However, as discussed above, it is undesirable to shut down the entire power and/or data supply system, and especially the power and/or data sources, when removing or adding a power and/or data supply component.

Accordingly, it would be desirable to simplify the installation, and to reduce the expense, the safety concerns, the effort, the technician requirement, and the skill involved in installing and servicing the power and/or data supply system for such electrical devices.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
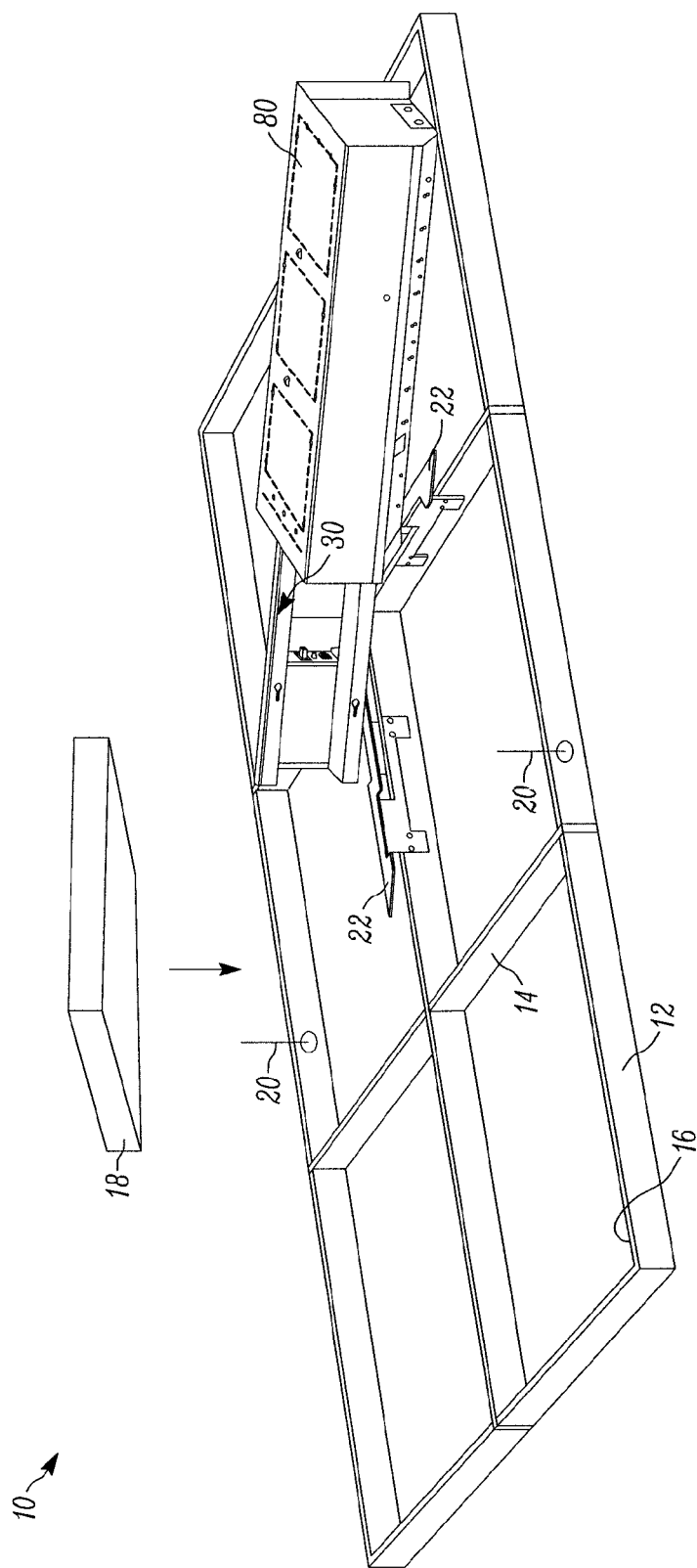
FIG. 1 is a perspective view of a system for distributing electrical power and/or data to one or more electrical devices mounted on an overhead drop ceiling framework during installation of a power and/or data system module in accordance with one embodiment of this disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

In accordance with one feature of this disclosure, a hot-swappable system distributes electrical power and/or data to one or more electrical devices. The system includes a source module electrically connected to an electrical power and/or data source, and a system module that is mounted on the source module. The source module has a module connector, and the system module is electrically connectable to, and disconnectable from, the module connector. The system module is removable from the source module for replacement without powering down the power and/or data source.

Advantageously, a plurality of source modules are mounted on a structure in succession, and a corresponding plurality of system modules are mounted on the source modules. The source modules are electrically connected in a daisy-chain configuration, and each system module is individually removable from its corresponding source module for replacement without powering down the power and/or data source, and without affecting the integrity of any of the other system modules. Each of the system modules is readily and safely hot-swappable or hot-pluggable, i.e., removable and replaceable without powering down, de-energizing, or shutting off the power and/or data source, or disturbing any of the other system modules, or the electrical devices that are being powered by the other system modules, or are sending or receiving data. During removal of the system modules, the connection to electrical ground is not lost and is always maintained. The overall installation is simpler, safer, is less expensive, minimizes down-time, does not require a technician, and involves less installation and servicing effort than heretofore.

In accordance with another feature of this disclosure, a method of distributing electrical power and/or data to an electrical device, is performed by electrically connecting a source module to an electrical power and/or data source, by mounting a system module on the source module, by electrically connecting the system module to a module connector of the source module, by removing the system module from the source module, and by disconnecting the system module from the module connector, for replacement of the system module without powering down the power and/or data source.

Figure 2:
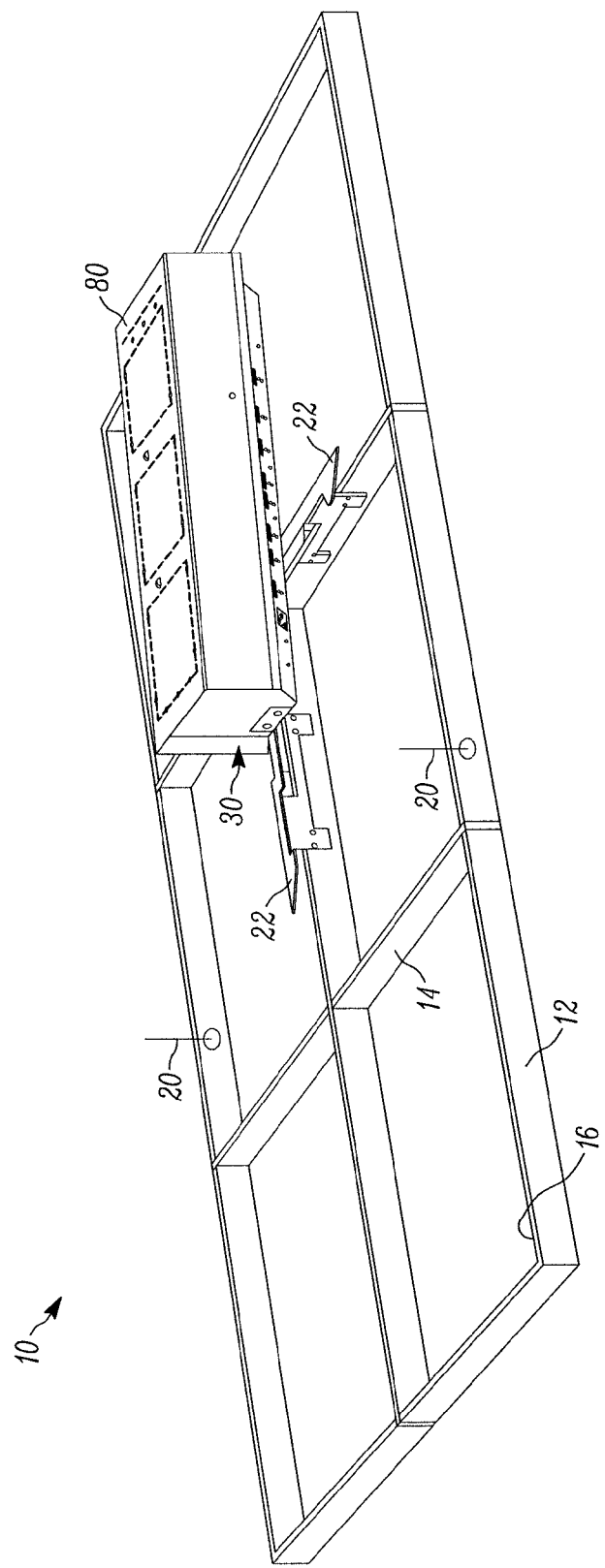
FIG. 2 is a view analogous to FIG. 1 after installation of the system module.

Turning now to FIG. 1-2 of the drawings, reference numeral 10 generally identifies an exemplary overhead structure in a suspended or drop ceiling having a rectangular grid framework of mutually orthogonal, elongated, frame elements 12, 14 lying in a ceiling plane and bounding a plurality of openings 16 for supporting a plurality of ceiling tiles and one or more electrical devices 18, e.g., lighting fixtures, loudspeakers, electrical controls, air conditioning units, electric fans, electric signs, and the like, each ceiling tile and electrical device 18 being of complementary contour to that of its supporting opening 16. The frame elements 12, 14 are each preferably formed, e.g., by folding and stamping, from a single piece of sheet metal. The openings 16 are preferably polygonal, e.g., square or rectangular in shape, each being typically sized at 2 feet by 2 feet, or 2 feet by 4 feet, or 4 feet by 4 feet, standards. As is conventional, the overhead structure 10 is suspended from a real ceiling of a building structure by threaded rods, or ceiling wires 20, or any equivalent supporting structure.

In accordance with this disclosure, a system distributes electrical power and/or data to one or more electrical devices 18, preferably associated with, or mounted on, a structure, such as the aforementioned overhead structure 10. The system may also be used to supply electrical power and/or data not only to such structure-mounted electrical devices, but also to other electrical equipment, such as computers, printers, copiers, and the like, located in an office or home environment in a room in which the overhead structure 10 is suspended. It will be understood that the system is not intended to be limited to the illustrated overhead structure 10, because, as described below in connection with FIGS. 13-16, the system can be associated with, or mounted on, many different types of structures in many different, diverse fields of use.

Figure 10:
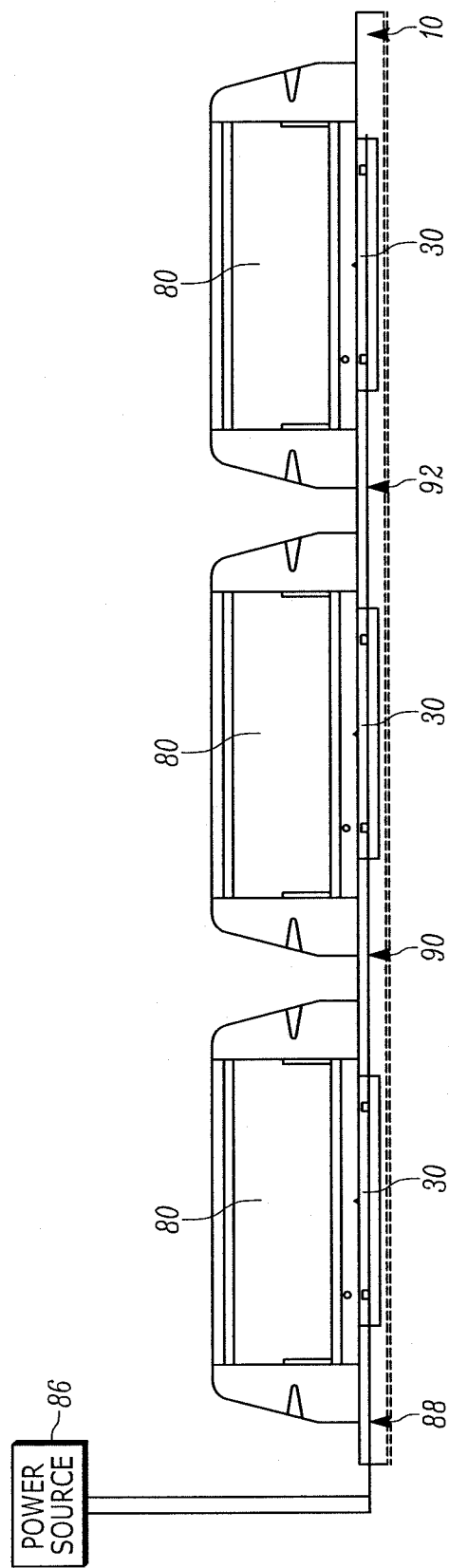
FIG. 10 is a side view of a plurality of system modules mounted on a plurality of source modules that are connected in a daisy-chain configuration.
Figure 12:
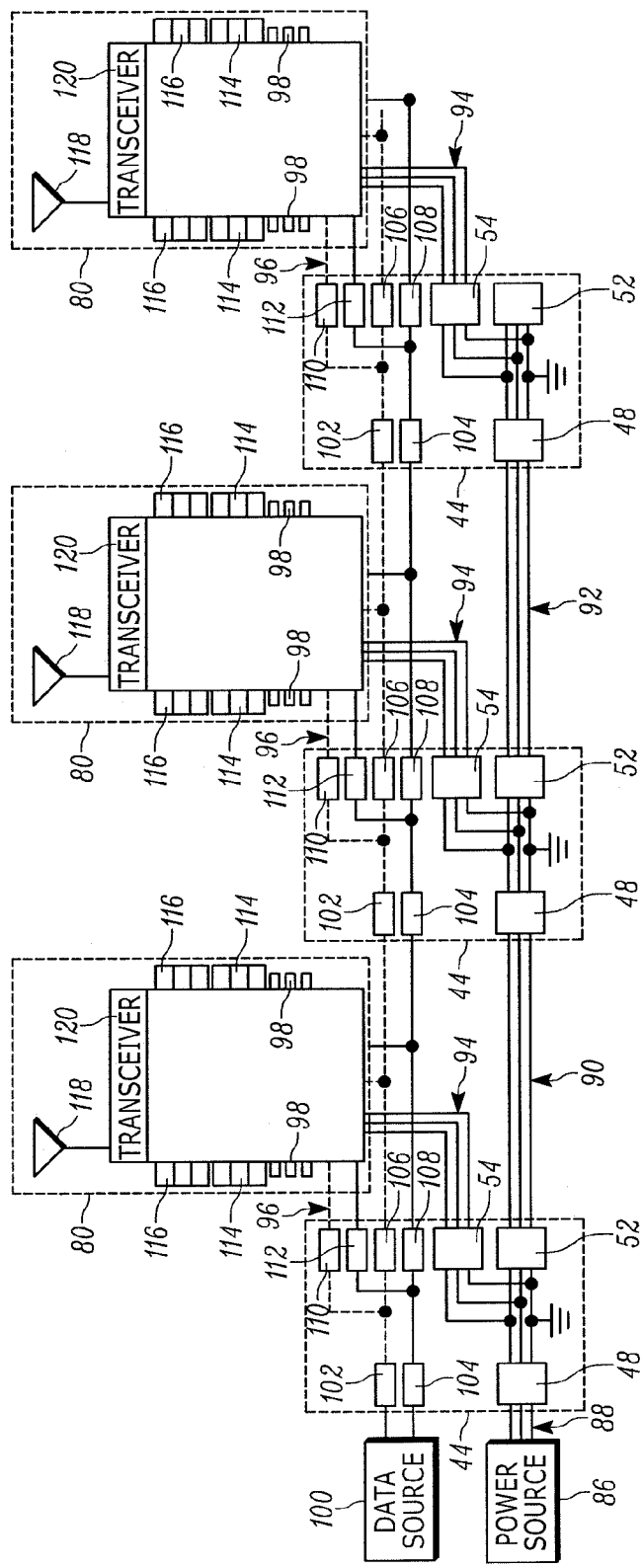
FIG. 12 is a view analogous to FIG. 11, but of the power wiring and of data wiring.

As shown in the embodiment of FIG. 12, a source module includes an elongated, channel-shaped, mounting rail 30 mounted on brackets 22 that, in turn, are mounted on the structure 10. Although the rail 30 is illustrated as being mounted at an angle relative to the frame elements 12, 14, the rail 30 could also be mounted in alignment with either one or more of the frame elements 12, or in alignment with one or more of the frame elements 14. Although not shown in FIGS. 1-2, a plurality of rails, as shown in FIG. 10, may be successively placed end-to-end to extend along a longitudinal direction lengthwise along the frame elements 12 or the frame elements 14. Each rail 30 has an interior channel 32, a generally horizontally planar base rail wall 34, a pair of upright rail walls 36, 38 that extend in mutual parallelism away from the base rail wall 34 along a vertical direction, and a pair of rail flanges 40, 42 that extend in opposite directions away from the upright rail walls 36, 38 in a generally horizontal plane that is generally parallel to the base rail wall 34.

Figure 3:
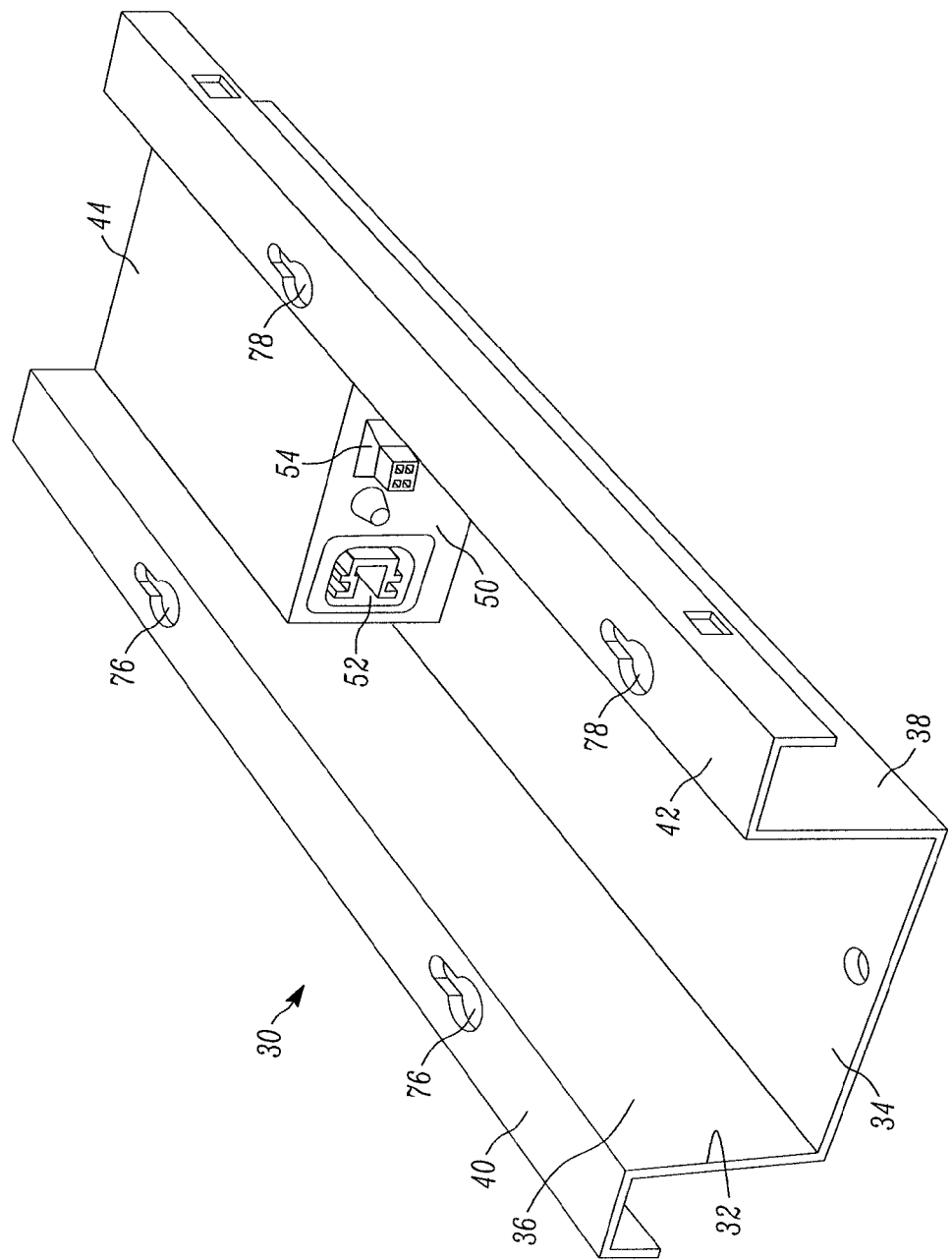
FIG. 3 is an enlarged, rear perspective view of a source module including a mounting rail and a junction box of the system of FIG. 1.
Figure 4:
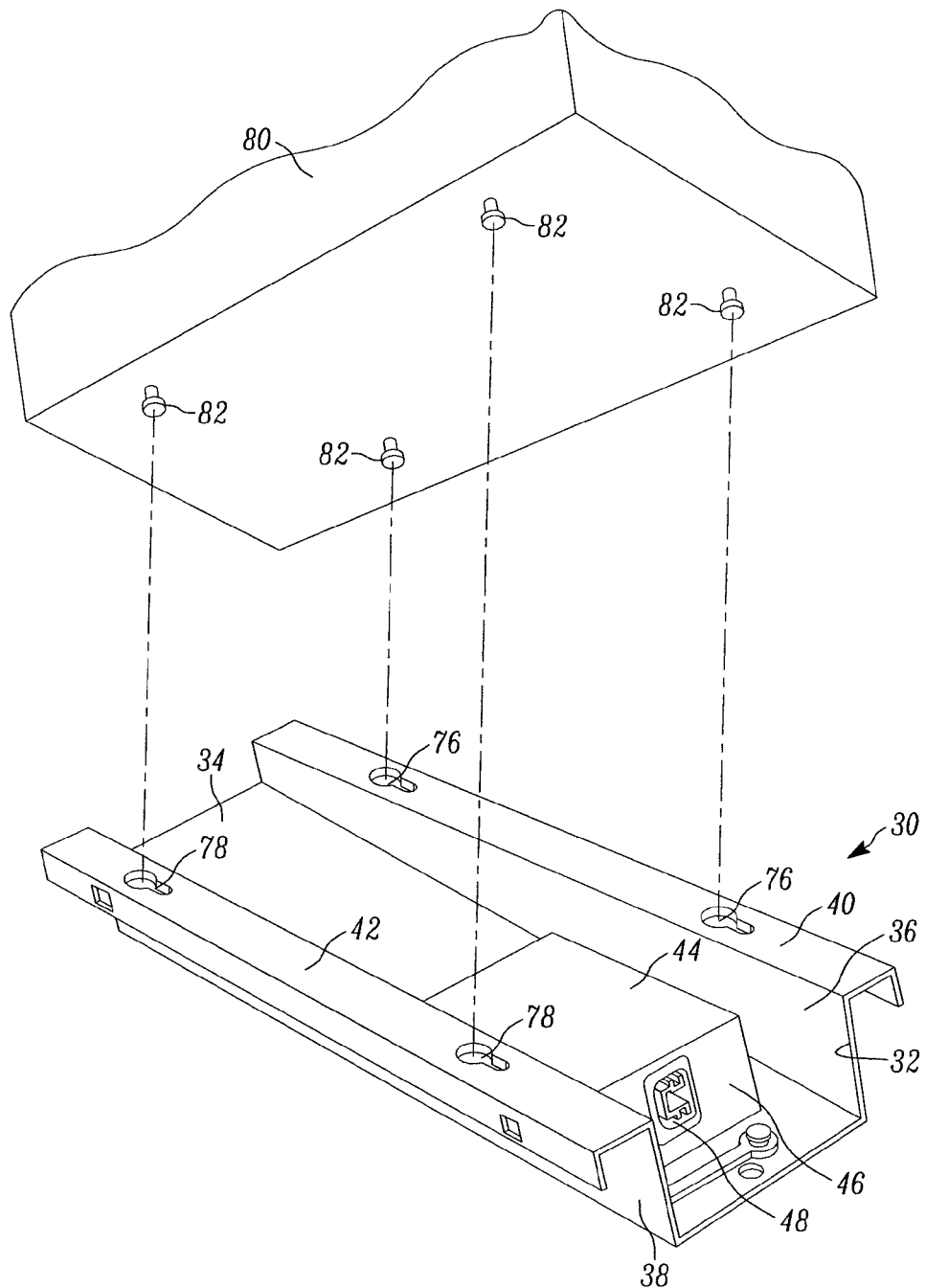
FIG. 4 is an enlarged, front perspective view of the source module of FIG. 3 and also showing how the system module is mounted on the mounting rail.
Figure 5:
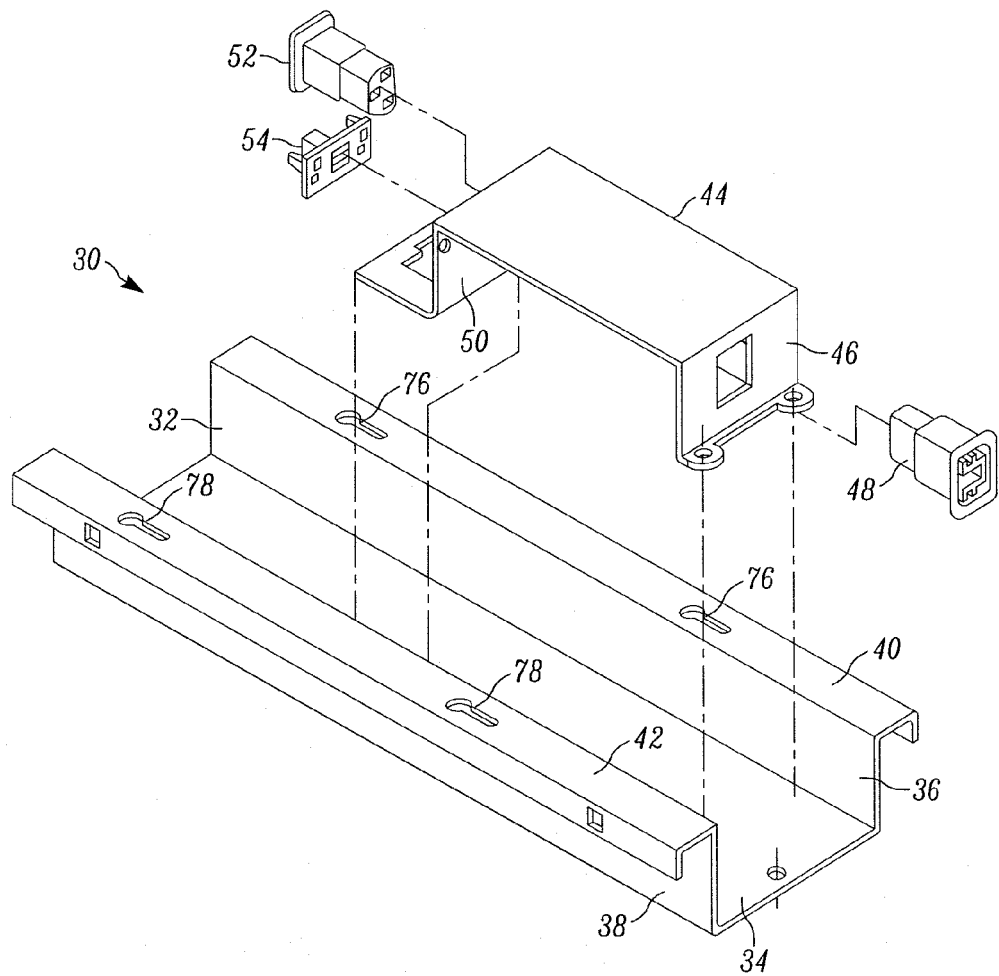
FIG. 5 is an exploded, perspective view of the source module of FIG. 3.

The source module also includes an electrical junction box 44 that is fixedly mounted in the channel 32 inside each rail 30. Thus, in FIG. 10, three junction boxes 44, one for each rail 30, are arranged in succession. As shown in FIGS. 3-5, each junction box 44 has a front wall 46 on which an input power receptacle or connector 48 is mounted. Each junction box 44 also has a rear wall 50 on which an output power receptacle or connector 52 and a module power connector 54 are mounted. Each power connector 48, 52 preferably has touch-proof, electrically-insulated sockets for safety. The module power connector 54 is preferably a blind mating interface (BMI) slide-type connector, which also has touch-proof, electrically-insulated sockets for safety. Each junction box 44 is internally electrically pre-wired to interconnect the connectors 48, 52, and 54, as described below in connection with FIG. 7. Each junction box 44 is mounted on a respective rail 30 in the channel 32 between the upright rail walls 36, 38 and is preferably positioned closer to one of the upright rail walk, e.g., 38, than to the other of the upright rail walls, e.g., 36, to bound a bypass alley 56 (see FIG. 6) along which one or more bypass cables 58 are routed, as described below.

Figure 6:
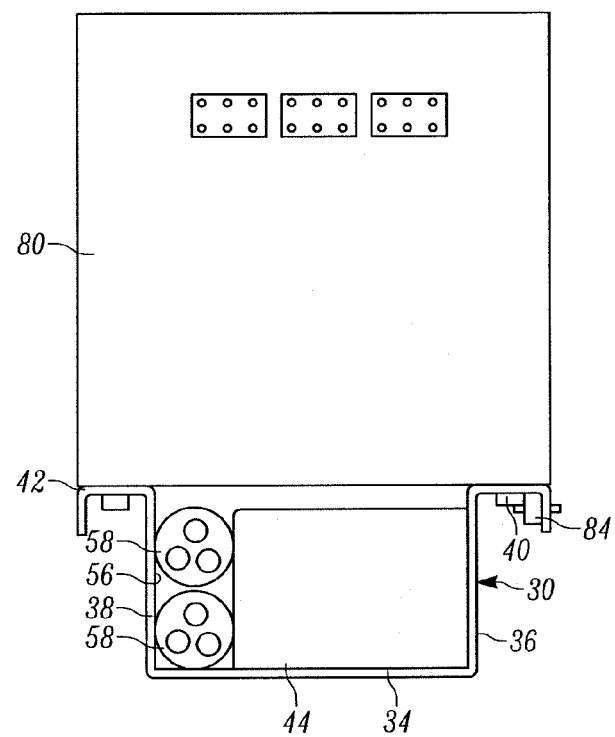
FIG. 6 is an enlarged, partially sectioned, side view of the system module mounted on the source module of FIG. 3.
Figure 9:
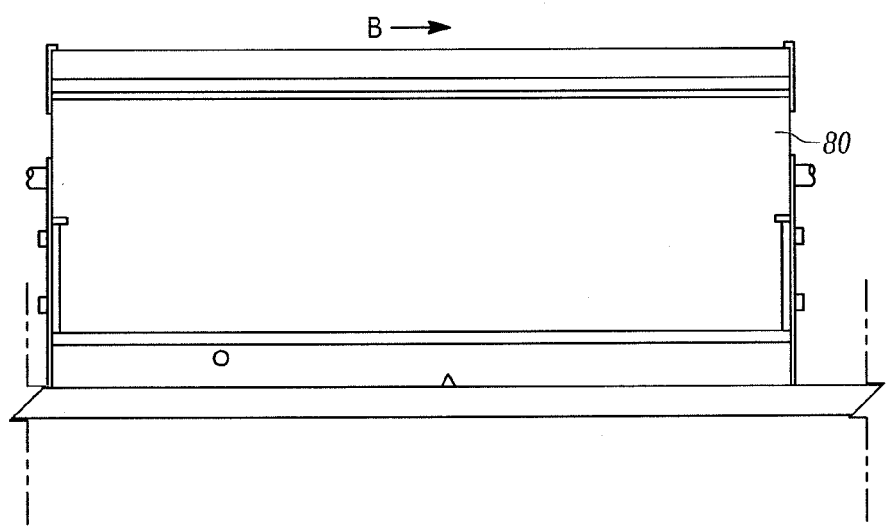
FIG. 9 is a view analogous to FIG. 8, after the system module has been mounted on the source module of FIG. 3.

As shown in FIGS. 1-2, 4, 6 and 8-10, one or more system modules 80 is mounted, one on each rail 30, at locations successively spaced apart along the longitudinal direction. As best shown in FIG. 6, each system module 80 rests, and is detachably and removably mounted, on the rail flanges 40, 42 of each rail 30. The rail flange 40 has a pair of keyhole slots 76 spaced apart lengthwise of each rail 30. The rail flange 42 has a pair of keyhole slots 78 spaced apart lengthwise of each rail 30. As shown in FIG. 4, each system module 80 has a plurality of mounting pins 82 that are inserted in a vertical direction downwardly into the keyhole slots 76, 78 in the direction of arrow A in FIG. 8. Then, as shown in FIG. 9, each system module 80 is moved and slid along the longitudinal direction in the direction of arrow B to lock the respective system module 80 to the respective rail 30. One or more security set screws 84, as best seen in FIG. 6, are turned to bear against the mounting pins 82 to further lock each system module 80 in its mounted position atop the respective rail 30.

Each system module 80 is individually removable from the respective rail 30 for replacement by reversing the above steps. Thus, the security set screws 84 are initially backed out to free the mounting pins 82. Then, each system module 80 is moved and slid longitudinally in the direction opposite to arrow B until the keyhole slots 76, 78 are cleared. Then, each system module 80 is lifted upwardly in the direction opposite to arrow A until the system module 80 clears the rail 30.

Figure 11:
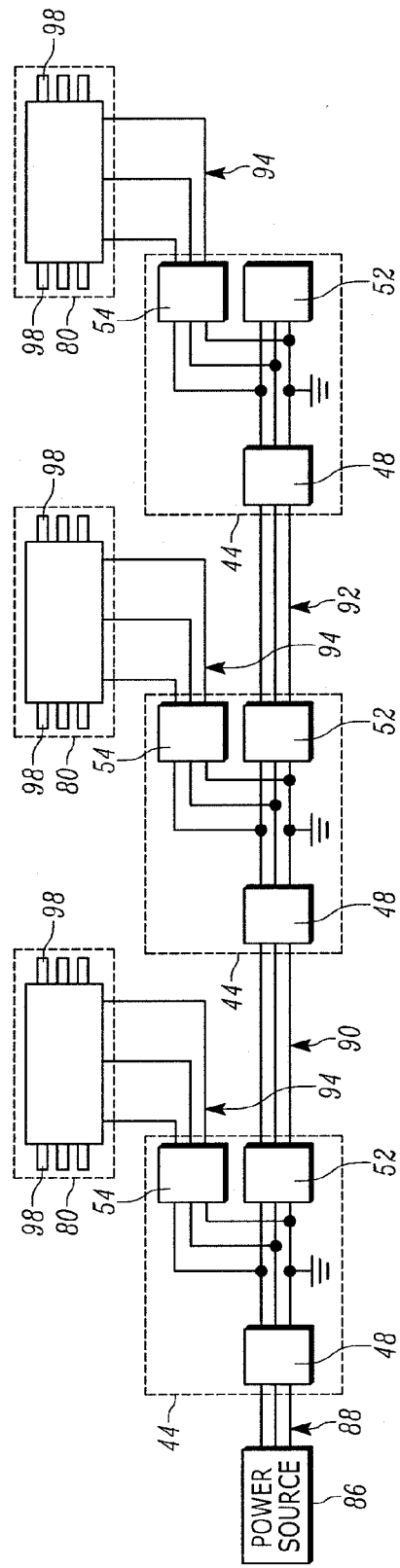
FIG. 11 is a wiring diagram of power wiring between each junction box and its associated system module in the daisy-chain configuration of FIG. 10.

The junction boxes 44 are electrically connected to each other in a daisy-chain configuration that is shown in FIGS. 10-12. More particularly, an electrical power source 86, for example, an AC source, e.g., 120 volts, or a high voltage DC source, is electrically connected by a first power cable 88 to the input power connector 48 of a first one of the junction boxes 44 inside a first one of the rails 30. The output power connector 52 of the first junction box is electrically connected by a second power cable 90 to the input power connector 48 of a second one of the junction boxes 44 inside a second one of the rails 30. The output power connector 52 of the second junction box is electrically connected by a third power cable 92 to the input power connector 48 of a third one of the junction boxes 44 inside a third one of the rails 30, and so on. Although three junction boxes have been illustrated in FIGS. 10-12 inside three rails 30, it will be understood that this is merely exemplary, because more and less than three such components could be so wired in the daisy-chain configuration. Electrical power from the power source 86 is thus delivered to each junction box 44 in succession.

Figure 7:
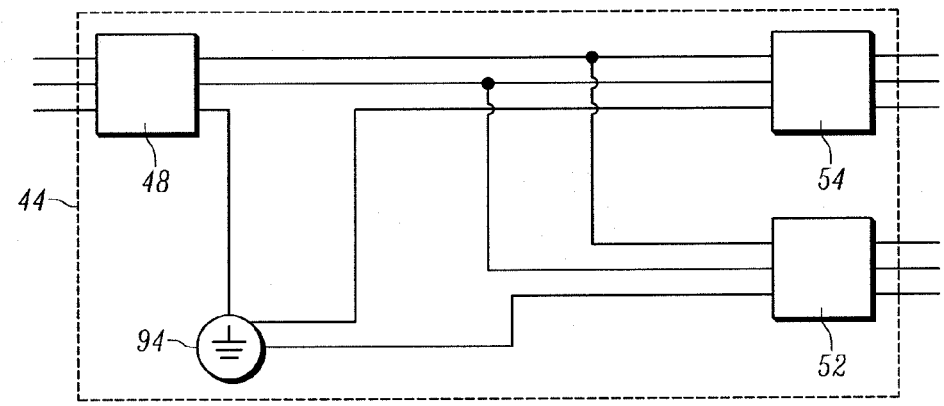
FIG. 7 is a wiring diagram of the wiring inside the junction box.
Figure 8:
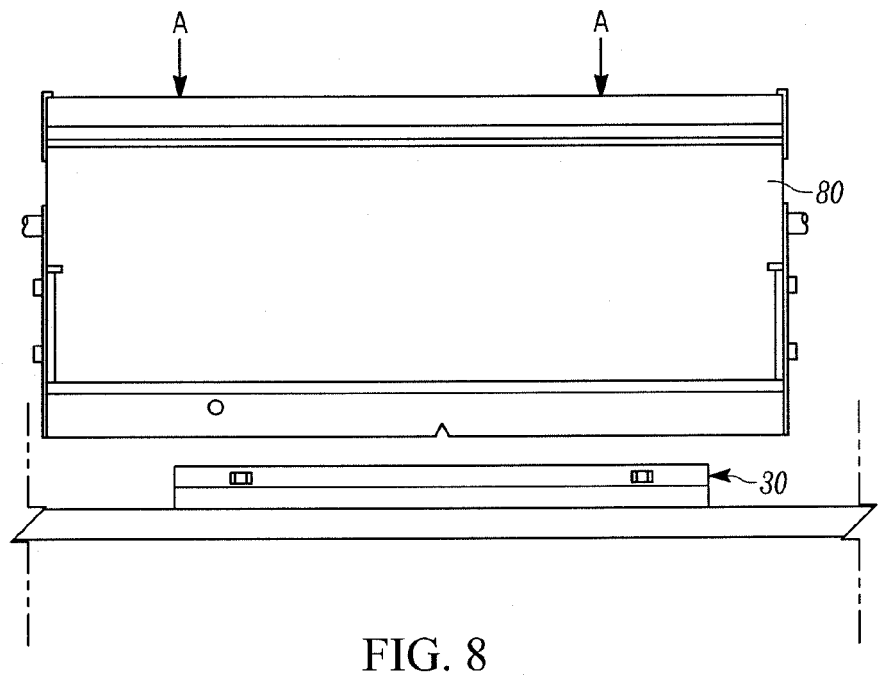
FIG. 8 is a side view of the system module of FIG. 1, prior to being mounted on the source module of FIG. 3.

The wiring inside each junction box 44 is depicted in FIG. 7. Three-phase wires are directly connected between the input power connector 48 and the output power connector 52. The three-phase wires are also connected between the input power connector 48 and the module power connector 54. The power connectors 48, 52, and 54 have a common electrical ground 94. Each junction box 44 is thus pre-wired. Two-phase wires may also be used. Access to each junction box 44 is only available exteriorly of the junction box 44 at the connectors 48, 52, and 54. During removal of any system module 80, the connection to the electrical ground 94 is not lost, and is always maintained.

As mentioned above, plugs at the ends of the cables 88, 90, and 92 are respectively inserted into the power connectors 48, 52 during installation, and are removed therefrom during servicing. As for the module power connectors 54, a module cable 94 (see FIGS. 11-12) extends away from each system module 80 and terminates in a module plug that is inserted into a respective module power connector 54 during installation, and that is removed therefrom during servicing. As previously mentioned, each module power connector 54 preferably has a BMI slide-type interface, and the module plug has the same interface. The module power connector 54 and the module plug automatically engage each other when the system module 80 is slid in the direction of the arrow B (see FIG. 9), and automatically disengage from each other when the system module 80 is slid in the direction opposite to the arrow B (see FIG. 9).

Each system module 80 preferably contains a power managing component, for example, an AC-to-DC power converter to convert incoming AC power to DC power, or a step-down DC-DC power converter to convert high voltage DC power to low voltage DC power, and then to supply and distribute the DC power to a plurality of DC terminals 98 for powering the electrical devices 24 with the DC power. As shown in FIGS. 11-12, each system module 80 preferably has six such DC terminals 98, advantageously each having 24 VDC. It will be understood that more or less than six such terminals could be employed. Wires can be routed from each DC terminal 98 to each electrical device 18 to be powered.

Each system module 80 is readily and safely hot-swappable or hot-pluggable, i.e., may be removed and replaced without powering down, de-energizing, or shutting off the power source 86. In addition, each system module 80 may be individually removed from its rail 30 for replacement without disturbing any of the other system modules 80, or the other junction boxes 44, or the electrical devices 18 that are being powered by the other system modules 80.

FIG. 12 is analogous to FIG. 11, but also includes, among other things, the distribution of data from a data source 100, such as a host system server, to the electrical devices 18. Input data connectors 102, 104 of different types on each junction box 44 are electrically connected to output data connectors 106, 108 of different types, as well as to data module connectors 110, 112 of different types. The data source 100 is electrically connected to the input data connectors 102, 104 on the first junction box 44, and to each successive junction box 44 in succession. Each system module 80 may also be electrically connected via a data cable 96 to the data module connectors 110, 112 on each junction box 44.

Each system module 80 preferably contains a data managing component, for example, a data distributor or converter to convert incoming data to output data, and then to distribute or supply the output data to a plurality of data terminals 114, 116 for supplying the output data to the electrical devices 18. As shown in FIG. 12, each system module 80 preferably has six data terminals 114 corresponding to one connector type, and six data terminals 116 of another connector type. It will be understood that more or less than six such terminals of each type could be employed. Wires can be routed from each data terminal 114, 116 to each electronic device 18 to be supplied with data. The different types of connectors may include an Ethernet connector, or an optical fiber connector, or a USB connector, or any of a wide variety of terminal connectors. Although two different types of connectors have been illustrated in FIG. 12, it will be understood that more or less than two different types of connectors may be used. Advantageously, the power and data connectors need not be separate, but can be integrated into a single Power over the Internet (PoE) connector, or a USB connector, such as USB version 3.1.

As before, each system module 80 is readily and safely hot-swappable or hot-pluggable, i.e., may be removed and replaced without powering down, de-energizing, or shutting off the data source 100. In addition, each system module 80 may be individually removed from its rail 30 for replacement without disturbing any of the other system modules 80, or the other junction boxes 44, or the other electrical devices 18 that are sending or receiving data to or from the other system modules 80.

Advantageously, each of the DC terminals 98 and each of the data terminals 114, 116 is individually controlled, either hard-wired or preferably wirelessly. Each system module 80 may further be equipped with an antenna 118 and a wireless transceiver 120 that receives a radio frequency signal at the antenna 118 and generates a control signal to open or close a control switch provided at each terminal 98, 114, 116.

As illustrated in FIG. 12, three system modules 80 are powered from a single power source 86, and/or receive data from a single data source 100. It will be understood that this is merely exemplary, because more or less than three system modules 80 may be arranged in the illustrated daisy-chain configuration. In some applications, it may be desired for some of the downstream system modules to be powered or send and receive data directly from their sources 86, 100, rather than indirectly through successive junction boxes 44. The aforementioned bypass cables 58 (FIG. 6) are employed in such cases to bypass one or more of the upstream junction boxes 44, and to be connected to junction boxes 44 further downstream.

Figure 13:
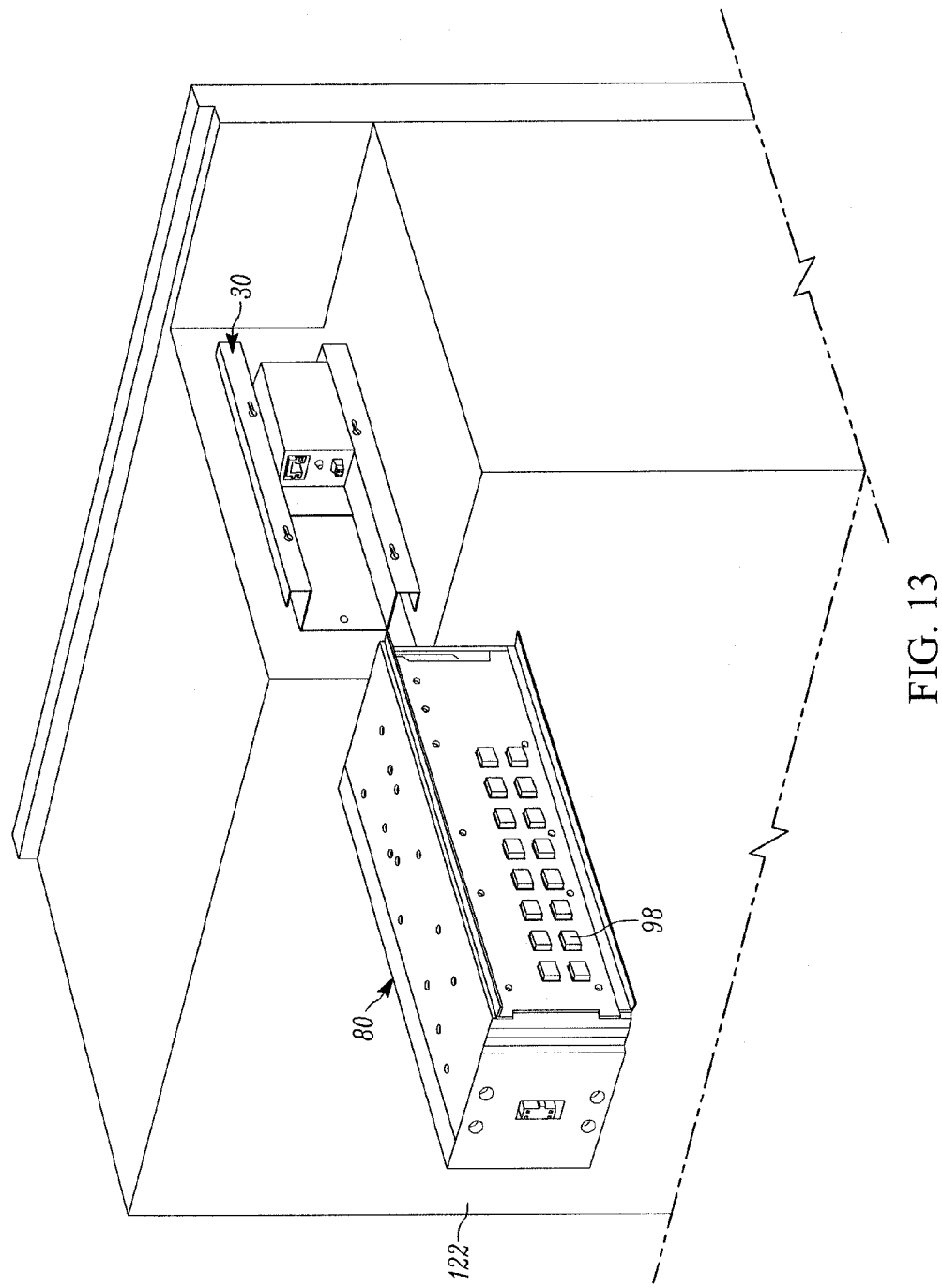
FIG. 13 is a broken-away, perspective view of a system for distributing electrical power and/or data during installation of a power and/or data system module on an electrical appliance in accordance with another embodiment of this disclosure.
Figure 14:
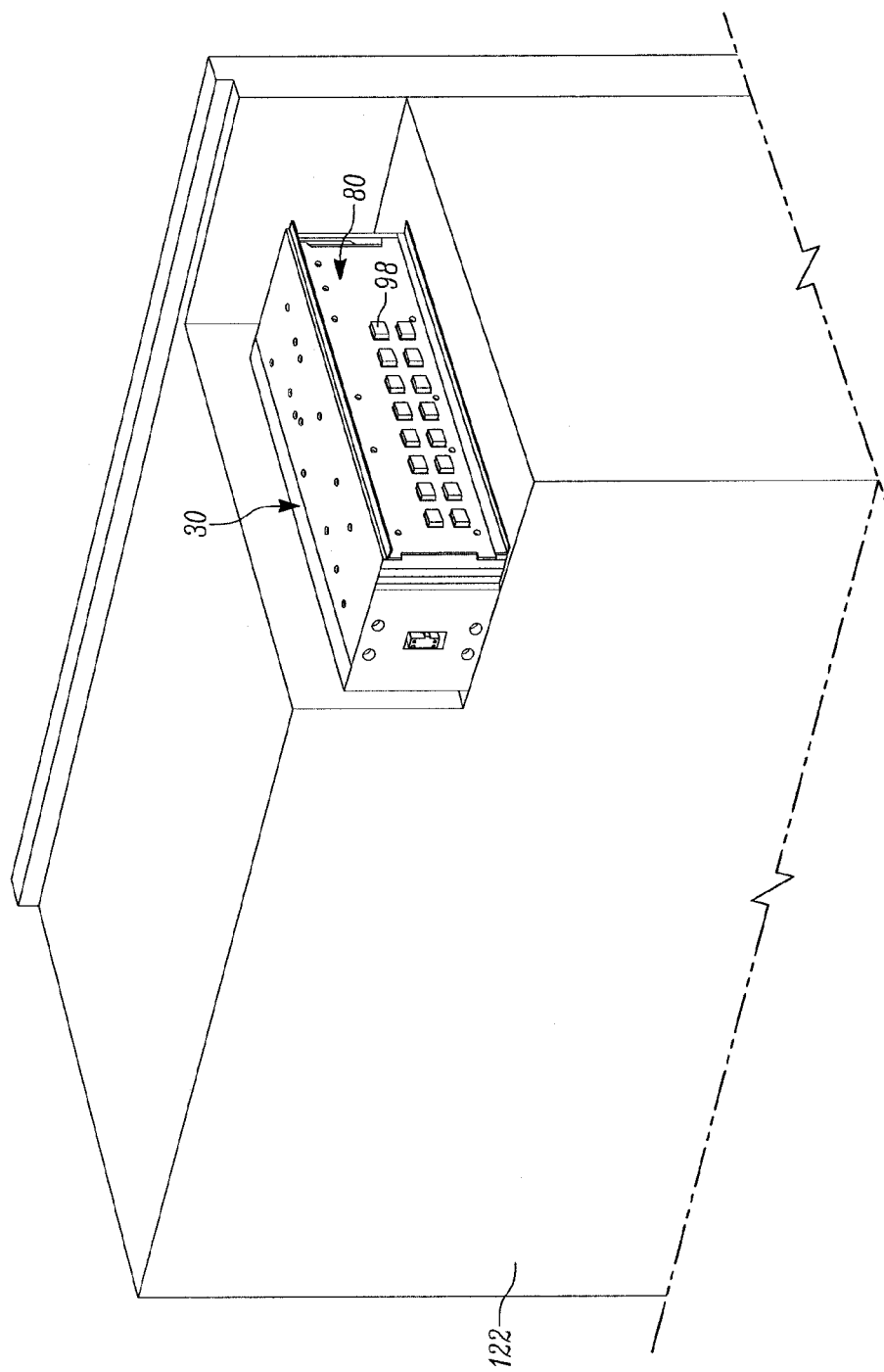
FIG. 14 is a view analogous to FIG. 13 after installation of the system module.
Figure 15:
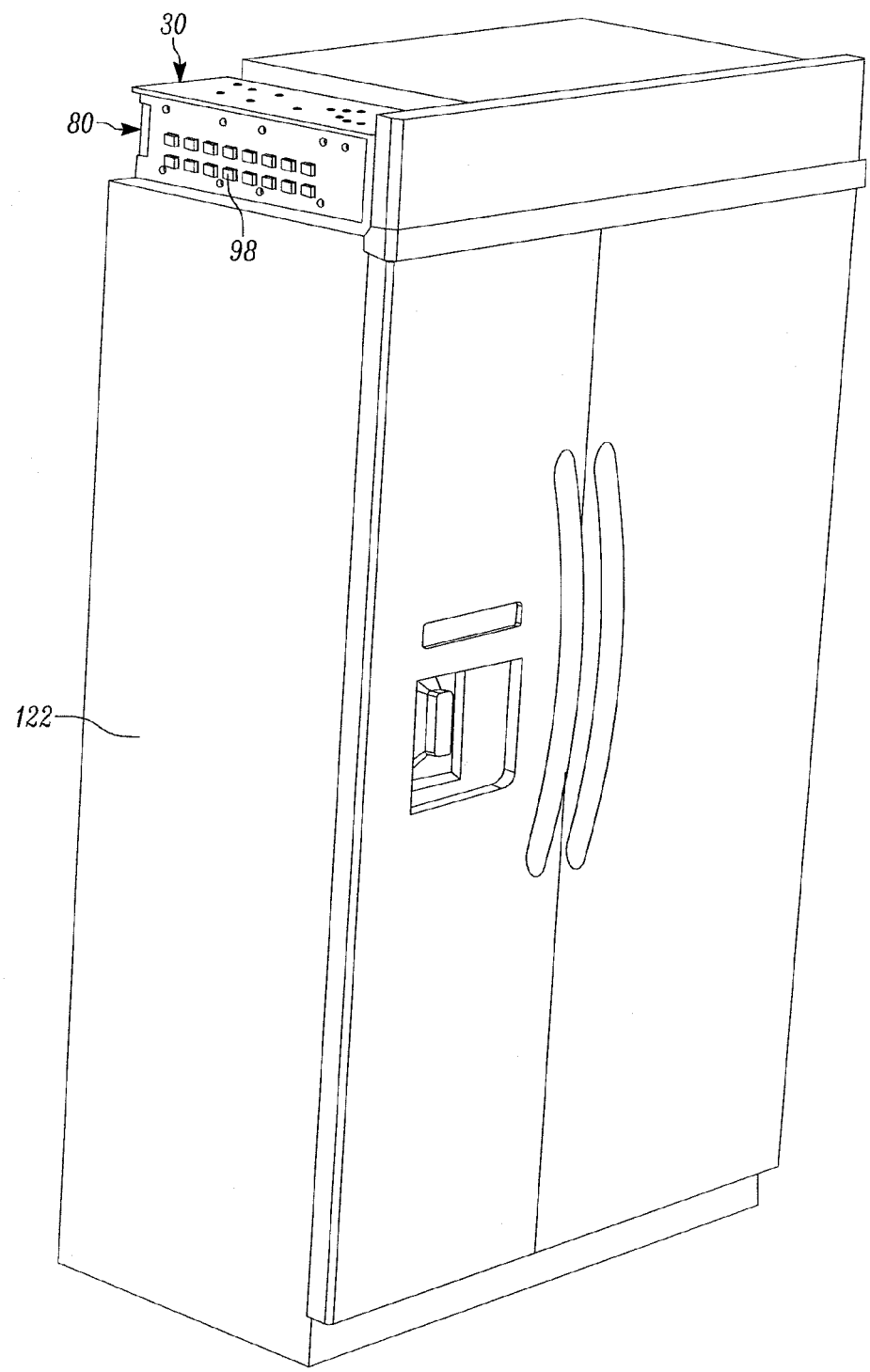
FIG. 15 is a front perspective view of the system of FIG. 13 mounted on the electrical appliance.

As shown in FIGS. 13-15, in another embodiment, rather than mounting the rail 30 on the overhead structure 10, the rail 30 can be mounted on a different structure, such as an electrical appliance 122, illustrated here as a refrigerator, and one or more system modules 80 can be mounted on the rails 30, as described above. Wires can be routed from each DC terminal 98 to each electrical device to be powered. In the case of a refrigerator, the electrical devices could be a motor, a computer, an ice maker, etc. Wires can also be routed from each DC terminal 98 to other electrical devices in a kitchen where the refrigerator 122 is located, in which case, the system module 80 acts as a power and/or data hub in the kitchen.

Figure 16:
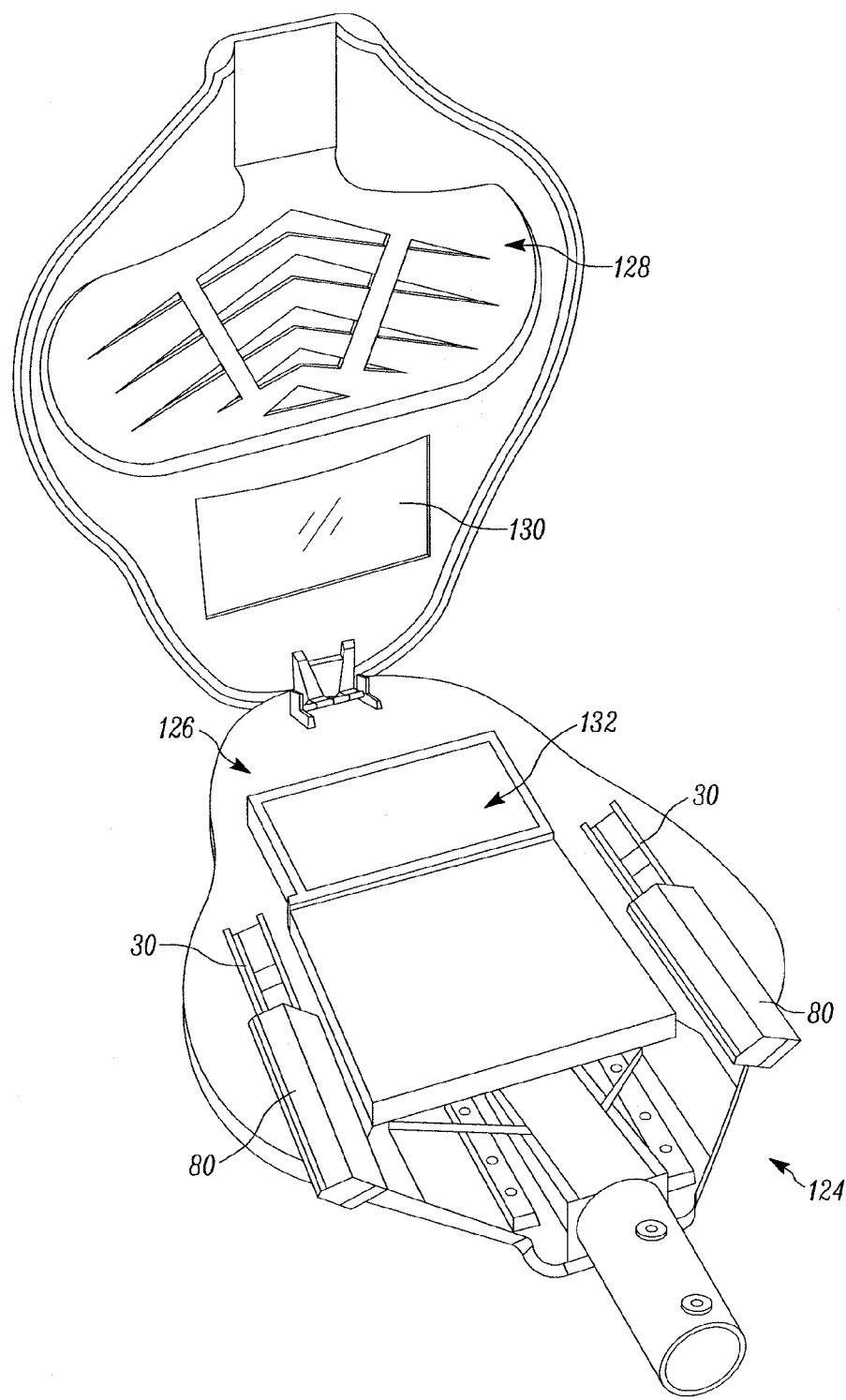
FIG. 16 is a perspective view of a system for distributing electrical power and/or data during installation of a power and/or data system module on an electrical luminaire in accordance with still another embodiment of this disclosure.

As shown in FIG. 16, in still another embodiment, rather than mounting the rail 30 on the overhead structure 10 or the appliance 122, the rail 30 can be mounted on a different structure, such as an outdoor electrical luminaire 124 of the type mounted at the top of lamp or street posts, and one or more system modules 80 can be mounted on the rails 30, as described above. The luminaire 124 includes a top cover 126, a bottom cover 128 having a light-transmissive lens plate 130, a lighting fixture 132 for emitting light through the lens plate 130, a pair of rails 30, and a corresponding pair of system modules 80, as described above. Wires can be routed from each DC terminal 98 on each system module 80 to each electrical device to be powered. The electrical devices could be the lighting fixture 132, or other electrical devices, such as ambient light sensors, traffic light controllers, traffic sensors, etc.

Figure 17:
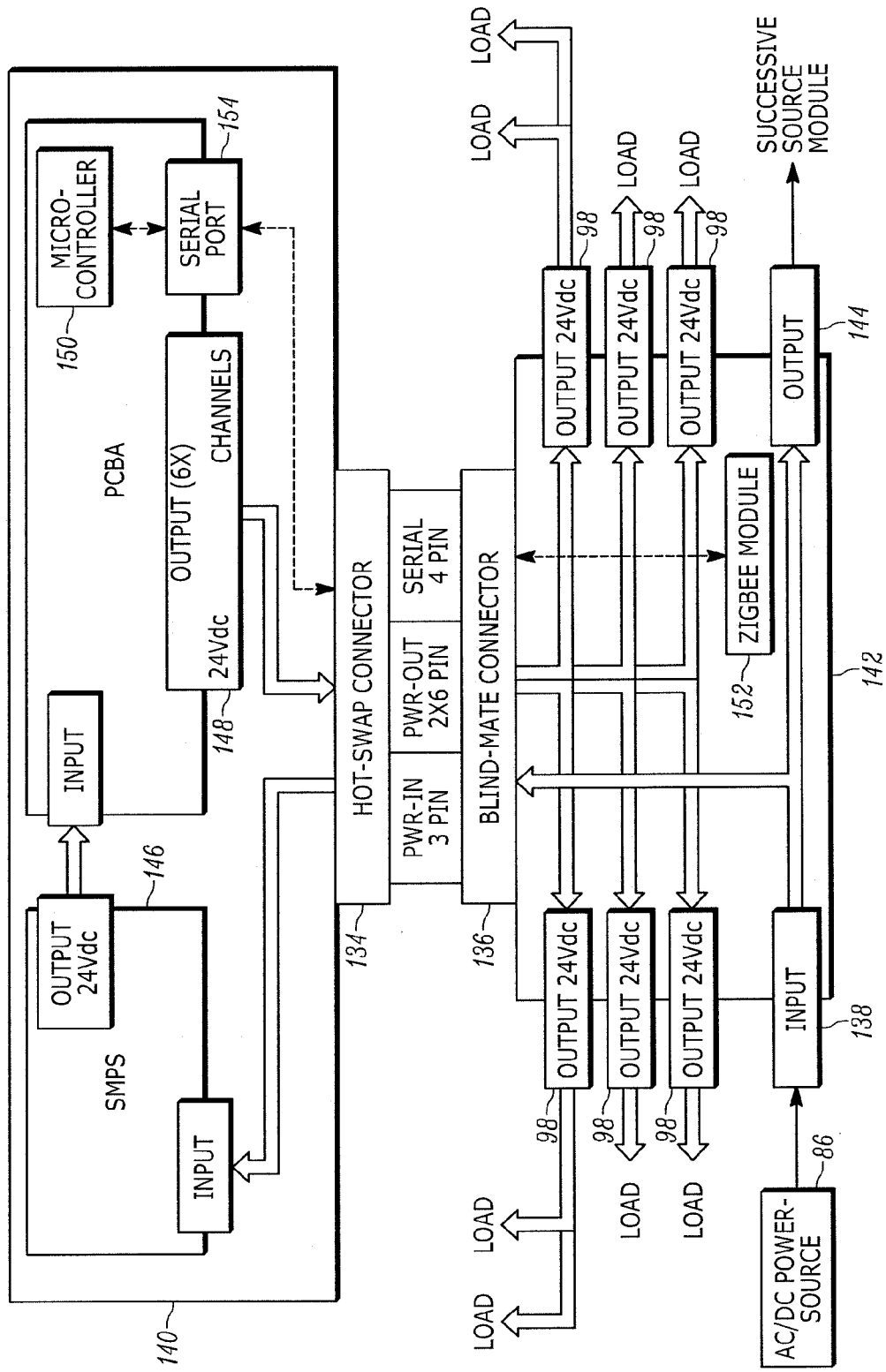
FIG. 17 is an electrical schematic of a system for distributing electrical power and/or data to one or more electrical devices in accordance with yet another embodiment of this disclosure.

As shown in FIG. 17, in still another embodiment, a multi-pin module connector 134 of a system module 140 is connectable to, and disconnectable from, a multi-pin module connector 136 of a source module 142. The AC and/or DC power source 86 is connected to an input connector 138 of the source module 142. The source module 142 also has an output connector 144 to conduct the AC and/or DC power through the source module 142 to a successive source module in the daisy-chain configuration described above in connection with FIGS. 10-12. The AC and/or DC power is also conducted through the connectors 134, 136 to a power managing component 146, for example, a switched mode power supply (SMPS), in the system module 140. The SNIPS generates a DC voltage that is conducted to a master controller 148 on a printed circuit board assembly (PCBA) having a micro-controller 150. The master controller 148 on the PCBA 148 generates a plurality of DC voltages that are conducted through the connectors 134, 136 to the above-described plurality of DC terminals 98 for powering a plurality of loads, e.g., the above-described electrical devices 24, with the DC voltages. Thus, in contrast to the previous embodiments, the DC terminals 98 are located on the source module 142, rather than on the system module 140. In addition, rather than using a mounting rail as a support in the source module 142, a mounting rail is not used in the embodiment of FIG. 17, and the source module 142 may be mounted on any supporting structure.

The module connector 136 is preferably designed such that it protects an individual removing the system module 140 and inserting a different system module from accidental contact with its energized pins that are conducting power and/or data. The module connector 136 preferably includes a safety ground pin, as well as power and/or data conductive pins. The module connector 136 is preferably a female-type socket with all its conductive pins being recessed and surrounded by an adequate insulation material, such as plastic, such that human contact with the power and/or data sources is prevented. The module connector 136 is known as a blind mating interface (BMI) slide-type connector, which also has touch-proof, electrically-insulated sockets for safety. Analogously, for safety reasons, the input connector 138 is preferably a male-type connector, and the output connector 144 is preferably a female-type connector.

In addition, an electronic identifier, such as a ZigBee module 152, or its equivalent, may be included in the source module 142 to communicate with the micro-controller 150, either wirelessly, or via the connectors 134, 136 and a serial port 154 on the master controller 148. The ZigBee module 152 can have a security code that identifies the source module 142. The ZigBee module 152 can, for example, insure that the correct system module 140 is connected to the correct source module 142.

Figure 18A:
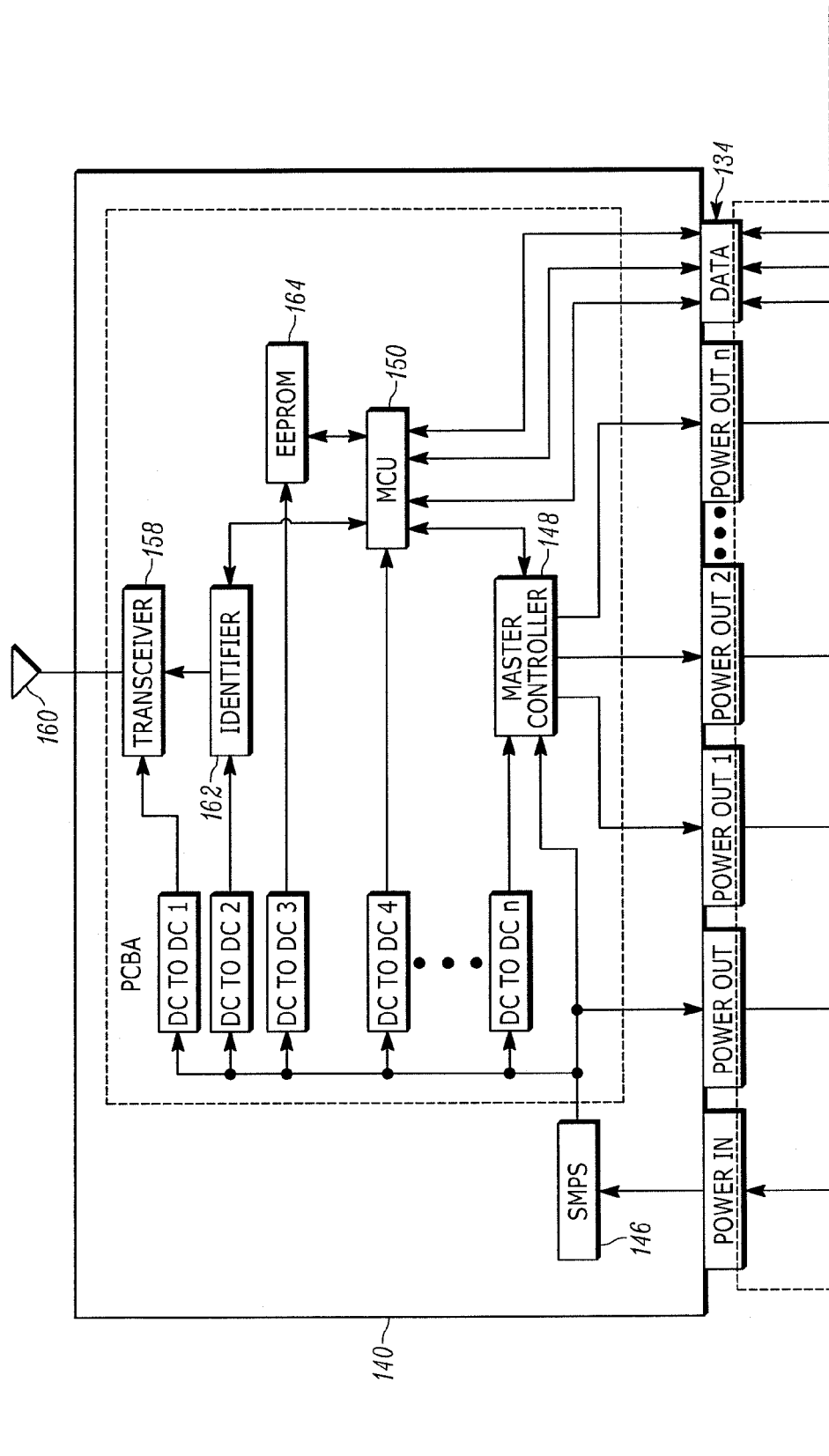
FIGS. 18A and 18B together constitute an electrical schematic of a system for distributing electrical power and/or data to one or more electrical devices in accordance with an additional embodiment of this disclosure.
Figure 18B:
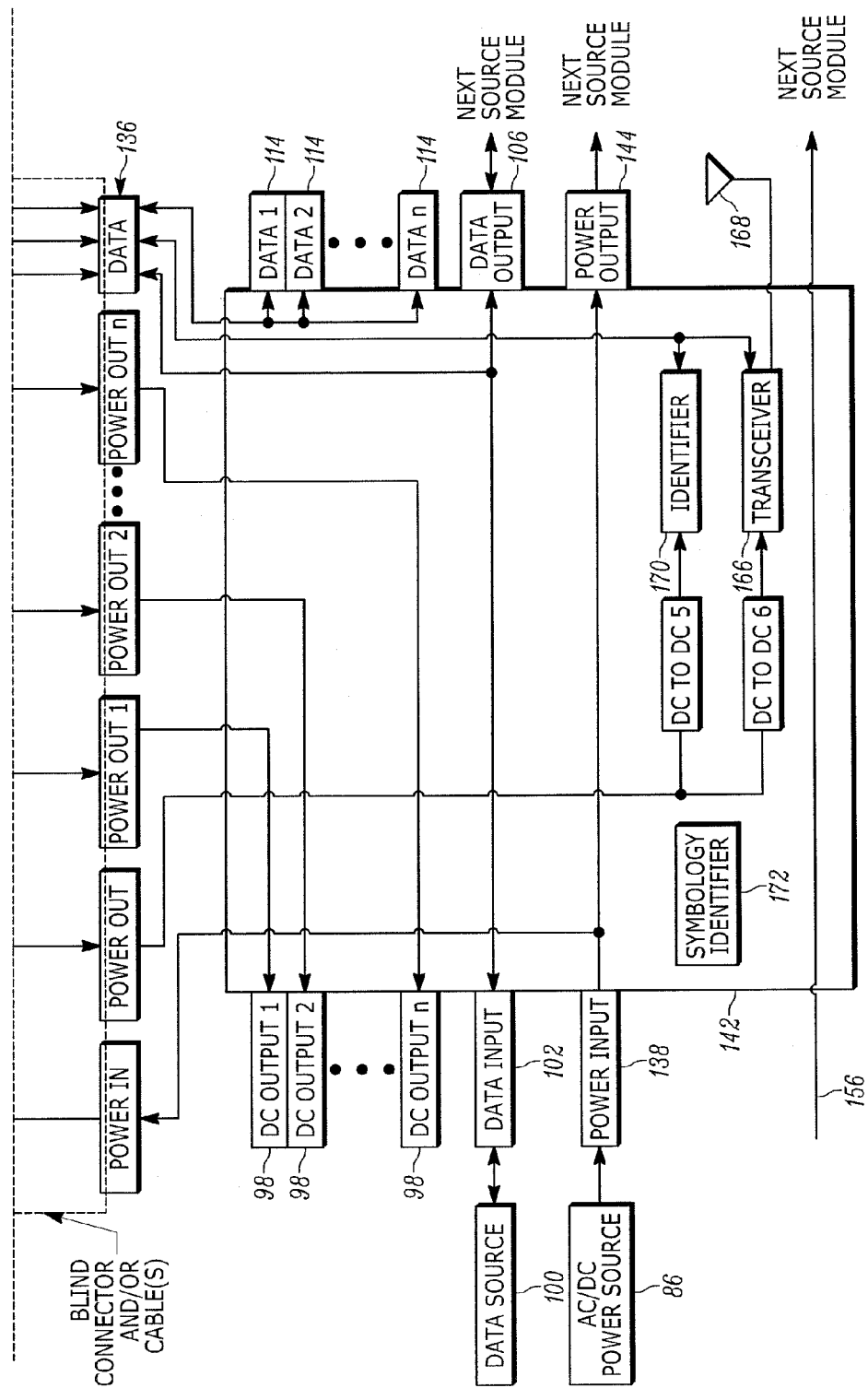

The embodiment of FIGS. 18A and 18B is analogous to that of FIG. 17, and like reference numerals have therefore been used. The AC and/or DC power source 86 is connected to the input connector 138 of the source module 142. The output connector 144 of the source module 142 conducts the AC and/or DC power through the source module 142 to a successive source module in the daisy-chain configuration described above in connection with FIGS. 10-12. In addition, the aforementioned data source 100 conducts data to the input data terminal 102 through the source module 142 to the output data terminal 106, and then, to a successive source module in the daisy-chain configuration described above in connection with FIGS. 10-12. A bypass cable 156 may be used to conduct power and/or data through or past the source module 142 to a successive source module.

The module connector 134 of the system module 140 is connectable to, and disconnectable from, the module connector 136 of the source module 142. Each connector 134, 136 may be configured as a single connector with multiple pins as described in FIG. 17, or may be configured as multiple connectors with multiple cables as shown in FIGS. 18A and 18B. The AC and/or DC power is also conducted through the connectors 134, 136 to the power managing component or SMPS 146 in the system module 140. The SMPS 146 generates a DC voltage that is conducted to the master controller 148 on the PCBA having the micro-controller 150. The master controller 148 generates the plurality of DC voltages that are conducted through the connectors 134, 136 to the above-described plurality of DC terminals 98 for powering a plurality of loads, e.g., the above-described electrical devices 24, with the DC voltages. As for FIG. 17, the DC terminals 98 in FIGS. 18A and 18B are located on the source module 142, rather than on the system module 140. The micro-controller 150 converts incoming data to output data, and then distributes or supplies the output data to the plurality of data terminals 114 for supplying the output data to the electrical devices or loads. In contrast to the previous embodiments, the data terminals 114 are located on the source module 142, rather than on the system module 140. In addition, a mounting rail is not used, and the source module 142 may be mounted on any supporting structure.

As also shown in FIGS. 18A and 18B, DC power can also be supplied in the system module 140 to a first wireless transceiver 158 having an antenna 160, a memory chip 164, a first electronic identifier 162, the micro-controller 150, and the master controller 148. The DC power can also be supplied to the source module 142 to a second wireless transceiver 166 having an antenna 168, and a second electronic identifier 170. The transceivers 158, 166 can wirelessly communicate with each other to compare their identifiers 162, 170, thereby insuring that the correct system module 140 is connected to the correct source module 142. In addition, a barcode symbol 172 may be applied to the source module 142 to insure correct pairing of the modules 140, 142.

In the foregoing specification, specific embodiments have been described. However, one of ordinary skill in the art appreciates that various modifications and changes can be made without departing from the scope of the invention as set forth in the claims below. For example, although the above description describes that the rail 30 and its channel 32 extend along a longitudinal direction, they need not be linear, but can be curved into arcuate shapes. In that event, the system modules 80 are not slid linearly as depicted by the arrow B in FIG. 9, but are connected to their respective rails by a circumferential or circular notion. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, or contains a list of elements does not include only those elements, but may include other elements not expressly listed or inherent to such process, method, article, or apparatus. An element proceeded by "comprises . . . a," "has . . . a," "includes . . . a," or "contains . . . a," does not, without more constraints, preclude the existence of additional identical elements in the process, method, article, or apparatus that comprises, has, includes, or contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1%, and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

The invention claimed is:

1. A hot-swappable system for distributing electrical power to an electrical device, comprising:
   a source module electrically connected to an electrical power source, the source module having a module connector, a mounting rail bounding a channel, and an electrical junction box mounted in the channel, the rail including a generally planar base rail wall, a pair of upright rail walls that extend away from the base rail wall, and a pair of rail flanges that extend in opposite directions away from the upright rail walls in a plane that is generally parallel to the base rail wall;
   a system module mounted on the source module and electrically connectable to, and disconnectable from, the module connector, the system module resting, and being detachably mounted, on the rail flanges, the system module being removable from the source module for replacement without powering down the power source; and
   a direct current (DC) terminal mounted on one of the source module and the system module, the DC terminal being connected to the electrical device for supplying DC power to the electrical device.

2. The system of claim 1, wherein the rail flanges have a plurality of keyhole slots, and wherein the system module has a plurality of mounting pins that are inserted into, and then moved, to lock the system module to the rail.

3. The system of claim 1, wherein the junction box is mounted on the rail between the upright rail walls and is positioned closer to one of the upright rail walls than to the other of the upright rail walls to bound a bypass alley along which a bypass cable is routed.

4. The system of claim 1, wherein the junction box includes an input connector and an output connector, and wherein the input connector of the junction box is electrically connected to the power source, and wherein the output connector of the junction box is electrically connected to an input connector of another junction box.

5. The system of claim 1, wherein the junction box includes an input power connector and an output power connector, wherein the module connector of the junction box is electrically connected to the input power connector to supply power to the system module, and wherein the input power connector, the output power connector, and the module connector of the junction box have a common electrical ground.

6. The system of claim 5, wherein the system module includes a power converter for converting the power received from the module connector to the DC power, and further comprising a plurality of DC terminals mounted on the one of the system module and the source module.

7. The system of claim 6, wherein each of the DC terminals is individually controlled.

8. The system of claim 1, wherein the junction box includes an input data connector and an output data connector, wherein the module connector of the junction box is electrically connected to the input data connector to supply data to the system module.

9. The system of claim 8, wherein the system module includes a data distributor for distributing the data received from the module connector to and from the electrical device, and further comprising a plurality of data terminals mounted on one of the source module and the system module.

10. The system of claim 9, wherein each of the data terminals is individually controlled.

11. A hot-swappable system for distributing data to and from an electrical device, comprising:
    a source module electrically connected to an electrically-powered data source, the source module having a module connector, a mounting rail bounding a channel, and an electrical junction box mounted in the channel, the rail including a generally planar base rail wall, a pair of upright rail walls that extend away from the base rail wall, and a pair of rail flanges that extend in opposite directions away from the upright rail walls in a plane that is generally parallel to the base rail wall;
    a system module mounted on the source module and electrically connectable to, and disconnectable from, the module connector, the system module resting, and being detachably mounted, on the rail flanges, the system module being removable from the source module for replacement without powering down the data source, and without disturbing the distribution of the data to and from the data source; and
    a data terminal mounted on one of the source module and the system module, the data terminal being connected to the electrical device for distributing the data to and from the electrical device.

12. A hot-swappable system for distributing electrical power to electrical devices mounted on a structure, comprising:
    a plurality of source modules mounted on the structure in succession, each source module having an input power connector, an output power connector, and a module power connector, the input power connector of one of the source modules being electrically connected to an electrical power source and being electrically connected to the output power connector and the module power connector, the output power connector of the one source module being electrically connected to the input power connector of a successive source module;
    a plurality of system power modules, one for each source module, each system power module being electrically connectable to, and disconnectable from, the module power connector of a respective source module, each system power module being individually removable from the respective source module for replacement without powering down the power source; and
    a plurality of direct current (DC) terminals mounted on one of each of the source module and its corresponding system module, the DC terminals being respectively connected to the electrical devices for supplying DC power to the electrical devices.

13. The system of claim 12, wherein the source modules include a plurality of mounting rails mounted on the structure in succession, each mounting rail bounding a channel, and a plurality of electrical junction boxes mounted in the respective channels, wherein each junction box includes an input data connector, an output data connector, and a module data connector, the input data connector of the one source module being electrically connected to a data source and being electrically connected to the output data connector and the module data connector, the output data connector of the one source module being electrically connected to the input data connector of the successive source module.

14. The system of claim 12, wherein each system module includes a power converter for converting the power received from the module connector to the DC power at the plurality of DC terminals for powering the electrical devices with the DC power.

15. The system of claim 14, wherein each of the DC terminals is individually controlled.

16. The system of claim 13, wherein each system module includes a data distributor for distributing the data received from the module connector to and from the electrical devices, and further comprising a plurality of data terminals mounted on one of each of the source module and its corresponding system module for supplying the electrical devices with the distributed data.

17. The system of claim 16, wherein each of the data terminals is individually controlled.

18. A hot-swappable method of distributing electrical power to an electrical device, comprising:
    electrically connecting a source module to an electrical power source, the source module having a module connector, a mounting rail bounding a channel, and an electrical junction box mounted in the channel, the rail including a generally planar base rail wall, a pair of upright rail walls that extend away from the base rail wall, and a pair of rail flanges that extend in opposite directions away from the upright rail walls in a plane that is generally parallel to the base rail wall;
    mounting a system module on the source module by resting and detachably mounting the system module on the rail flanges, and electrically connecting the system module to the module connector;
    removing the system module from the source module, and disconnecting the system module from the module connector, for replacement of the system module without powering down the power source; and
    mounting a direct current (DC) terminal on one of the source module and the system module, and connecting the DC terminal to the electrical device for supplying DC power to the electrical device.

19. The method of claim 18, and arranging additional source modules in succession; and mounting additional system modules, one for each source module, on the source modules in succession.

* * * * *